United States Patent
Yu et al.

(10) Patent No.: US 9,478,280 B2
(45) Date of Patent: Oct. 25, 2016

(54) PROGRAMMED DATA VERIFICATION FOR A SEMICONDUCTOR MEMORY DEVICE

(71) Applicant: SAMSUNG ELECTRONICS CO., LTD., Suwon-Si, Gyeonggi-Do (KR)

(72) Inventors: Jae-Duk Yu, Seoul (KR); Dong-Ku Kang, Seongnam-si (KR); Dae-Yeal Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/742,726

(22) Filed: Jun. 18, 2015

(65) Prior Publication Data

US 2016/0019975 A1    Jan. 21, 2016

(30) Foreign Application Priority Data

Jul. 21, 2014  (KR) .......................... 10-2014-0092079

(51) Int. Cl.
| | |
|---|---|
| *G11C 11/56* | (2006.01) |
| *G11C 16/34* | (2006.01) |
| *G11C 16/10* | (2006.01) |
| *G11C 5/14* | (2006.01) |

(52) U.S. Cl.
CPC ........... *G11C 11/5628* (2013.01); *G11C 5/143* (2013.01); *G11C 16/10* (2013.01); *G11C 16/3454* (2013.01); *G11C 16/3459* (2013.01)

(58) Field of Classification Search
CPC ... G11C 16/3459; G11C 16/10; G11C 16/26; G11C 16/0483; G11C 16/5628
See application file for complete search history.

(56) References Cited

U.S. PATENT DOCUMENTS

| | | | | |
|---|---|---|---|---|
| 6,229,736 B1* | 5/2001 | Song | .................. | G11C 16/3404 365/185.22 |
| 6,243,290 B1* | 6/2001 | Kurata | ................ | G11C 11/5621 365/185.03 |
| 7,145,806 B2 | 12/2006 | Kawai | | |
| 7,889,566 B2 | 2/2011 | Kang | | |
| 8,085,600 B2 | 12/2011 | Kang | | |
| 8,174,902 B2 | 5/2012 | Lee et al. | | |
| 8,374,031 B2 | 2/2013 | Yuh | | |
| 8,488,384 B2 | 7/2013 | Kim | | |
| 8,559,229 B2 | 10/2013 | Kim et al. | | |
| 2010/0103726 A1* | 4/2010 | Bae | ........................ | G11C 5/143 365/163 |
| 2010/0329031 A1* | 12/2010 | Lee | ..................... | G11C 11/5628 365/185.22 |
| 2012/0075931 A1* | 3/2012 | Yuh | ..................... | G11C 11/5628 365/185.17 |
| 2013/0051152 A1 | 2/2013 | Lee et al. | | |
| 2013/0265829 A1 | 10/2013 | Suzuki | | |

* cited by examiner

*Primary Examiner* — Richard Elms
*Assistant Examiner* — Ajay Ojha
(74) *Attorney, Agent, or Firm* — Volentine & Whitt, PLLC

(57) ABSTRACT

A semiconductor memory device is configured to perform a first verification operation by setting an initial voltage level of a verification voltage to a first voltage level and boosting the verification voltage during a first period. The semiconductor memory device includes a memory cell array that stores program data, a sensor generating sensing data, and a condition determination unit comparing the program data and the sensing data. A control logic unit includes a verification operation controller configured to selectively perform, based on a result of comparison of the program data and the sensing data, a first verification control operation for controlling a second verification operation by setting the initial voltage level to a second voltage level and boosting the verification voltage during a second period, and a second verification control operation for controlling the second verification operation by setting the initial voltage level to the first voltage level and boosting the verification voltage during the first period.

20 Claims, 11 Drawing Sheets

IDENTIFICATION CODE (ICode) = ($f_{V1}$ $f_{V2}$ $f_{V3}$)

PROGRAMMED DATA VERIFICATION FOR A SEMICONDUCTOR MEMORY DEVICE

CROSS-REFERENCE TO RELATED APPLICATION

This application claims the benefit of Korean Patent Application No. 10-2014-0092079, filed on Jul. 21, 2014, in the Korean Intellectual Property Office, the disclosure of which is incorporated herein in its entirety by reference.

BACKGROUND

The inventive concept relates to a semiconductor memory device, a semiconductor memory system including the same, and a method of verifying the system, and more particularly, to a semiconductor memory device whose reliability and performance are improved by controlling an initial voltage level when performing verification operations, and a semiconductor memory system including the device.

When a verification operation is performed with respect to a programmed state generated according to each piece of data programmed into memory cells in a semiconductor memory device and a semiconductor memory system, a setup operation of a verification voltage corresponding to the programmed state is initiated. In other words, the setup operation indicates an operation of converting the verification voltages from a first level to a second level. An amount of time necessary for a setup operation of word lines varies depending on whether or not a verification of the programmed states is complete. This causes a time taken for the setup operation of word lines to vary according to the programmed states, leads to deterioration of the semiconductor memory device and the semiconductor memory system including the device, and thus decreases reliability of program data.

SUMMARY

The inventive concept provides a semiconductor memory device, a semiconductor memory system including the same, and a method of verifying the system. Reliability of program data may be secured by preventing deterioration of the semiconductor memory device and the semiconductor memory system.

According to an aspect of the inventive concept, there is provided a semiconductor memory device configured to perform a first verification operation by setting an initial voltage level of a verification voltage to a first voltage level and boosting the verification voltage during a first period. The semiconductor memory device includes a memory cell array including a plurality of memory cells configured to store program data, a sensor configured to generate sensing data by sensing the program data from the memory cell array, and a condition determination unit configured to compare the program data and the sensing data. A control logic unit includes a verification operation controller configured to selectively perform, based on a result of the comparison of the program data and the sensing data, a first verification control operation for controlling a second verification operation by setting the initial voltage level to a second voltage level and boosting the verification voltage during a second period, and a second verification control operation for controlling the second verification operation by setting the initial voltage level to the first voltage level and boosting the verification voltage during the first period. In other words, the verification operation controller is configured to selectively perform either the first verification control operation or the second verification control operation, based on a result of the comparison of the program data and the sensing data.

The first period and the second period may be the same length. Program data stored in one selected from the plurality of memory cells may be at least 2 bits. The program data may be programmed to the plurality of memory cells by using an incremental step pulse programming (ISPP) method. The second voltage level may be higher than the first voltage level.

The condition determination unit may include a verification unit configured to perform the comparison of the program data and the sensing data, and an identification code generator configured to generate an identification code based on the result of the comparison and transmitting the identification code to the control logic unit. The number of bits of the identification code may be set based on the number of types of program states stored in each of the plurality of memory cells.

The verification operation controller may generate a control signal for setting a magnitude of the second voltage level based on the result of comparison of the program data and the sensing data. The semiconductor memory device may further include a voltage generator configured to set the initial voltage level to the second voltage level having the magnitude based on the control signal and boosting the initial voltage level during the second period and applying the verification voltage to a word line connected to each of the plurality of memory cells.

The voltage generator may include: a program voltage generator configured to generate a program voltage when a programming operation is performed and applying the program voltage by controlling on and off of a first switch; and a verification voltage generator configured to generate a verification voltage when a verification operation is performed and applying the verification voltage to the word line by controlling on and off of a second switch. The verification operation controller may apply the verification voltage to the word line by turning off the first switch and turning on the second switch when a voltage of the word line is reduced to the second voltage level from a level of the program voltage. The verification operation controller may further include: a timing controller configured to control on and off timings of the first and second switches; and an initial voltage controller configured to control a setting operation of an initial voltage level of the verification voltage generator.

When the program voltage generator generates and applies the program voltage to each of the plurality of memory cells, the timing controller may turn off the first switch when the program voltage is converted to the first voltage level, the verification voltage generator may turn on the second switch when the first switch is off, and the initial voltage controller may set the initial voltage level to the first voltage level. When the program voltage generator generates and applies the program voltage to each of the plurality of memory cells, the timing controller may turn off the first switch when the program voltage is converted to the second voltage level, the verification voltage generator may turn on the second switch when the first switch is off, and the initial voltage controller may set the initial voltage level to the second voltage level.

The semiconductor memory device may be s a flash memory device.

According to another aspect of the inventive concept, there is provided a semiconductor memory device configured to perform a plurality of programming loops including a programming operation and a verification operation. The semiconductor memory device includes a control logic unit including a verification operation controller configured to perform, based on a result of comparing the program data and the sensing data, a first verification control operation for controlling a second verification operation by setting the initial voltage level to a second voltage level and boosting the verification voltage during a second period, or a second verification control operation for controlling the second verification operation by setting the initial voltage level to the first voltage level and boosting the verification voltage during the first period.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
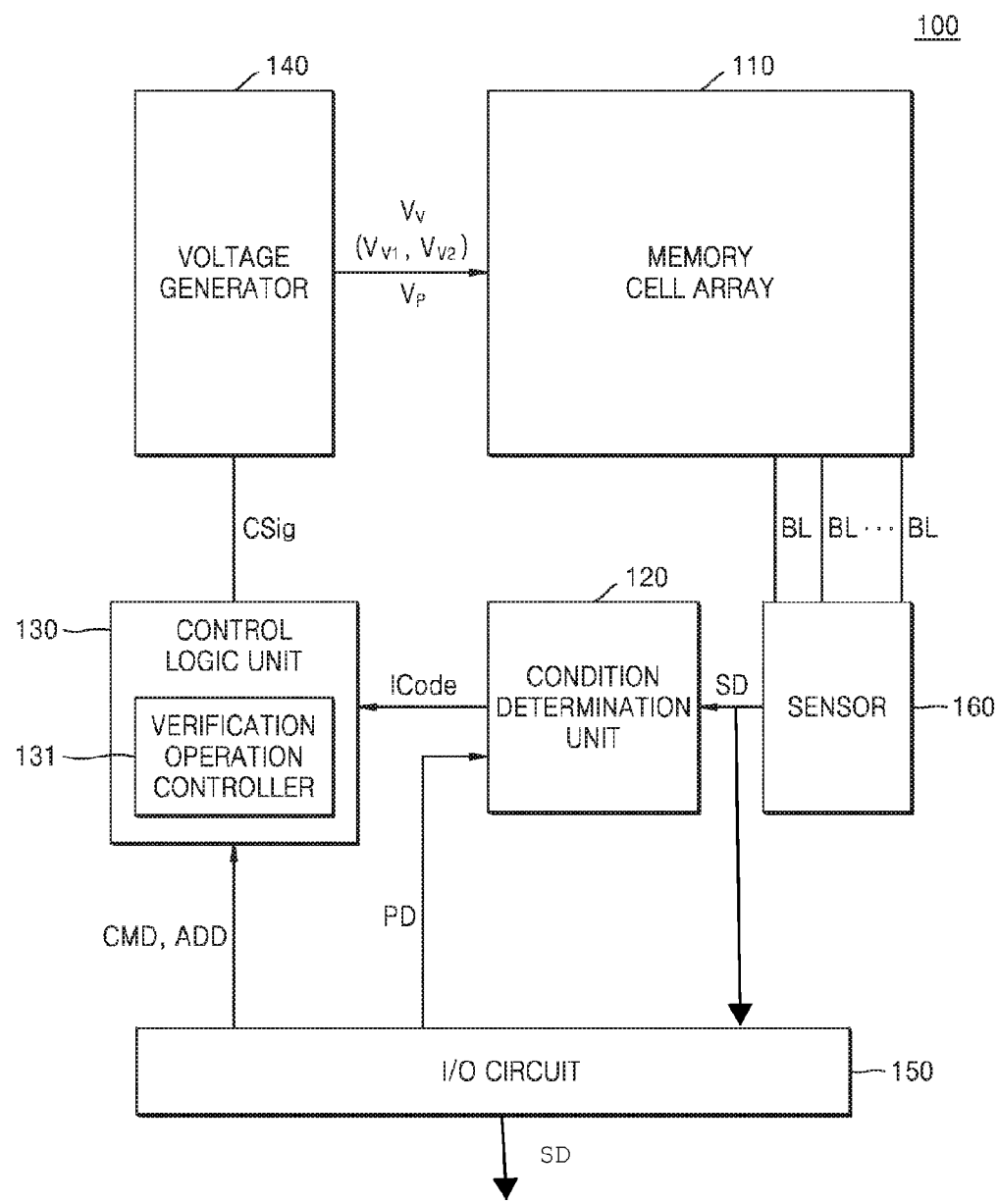
FIG. 1 is a block diagram of a semiconductor memory device according to an exemplary embodiment.

Reference will now be made in detail to exemplary embodiments of the inventive concept, examples of which are illustrated in the accompanying drawings. The exemplary embodiments are merely provided to fully describe the present inventive concept to one of ordinary skill in the art to which the present inventive concept pertains. As the present inventive concept allows for various changes and numerous exemplary embodiments, particular exemplary embodiments will be illustrated in the drawings and described in detail in the written description. However, this is not intended to limit the present inventive concept to particular modes of practice, and it will be understood that all changes, equivalents, and substitutes that do not depart from the spirit and technical scope of the present inventive concept are encompassed in the present inventive concept. Like reference numerals refer to like elements throughout. Sizes of components in the drawings may be exaggerated for clarity. As used herein, the term "and/or" includes any and all combinations of one or more of the associated listed items. Expressions such as "at least one of," when preceding a list of elements, modify the entire list of elements and do not modify the individual elements of the list.

The terms used in the present specification are merely used to describe particular exemplary embodiments, and are not intended to limit the present inventive concept. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components must not be limited to the above terms. The above terms are used only to distinguish one component from another. For example, within the scope of the present inventive concept, a first component may be referred to as a second component, and vice versa.

Unless defined otherwise, all terms used in the description including technical or scientific terms have the same meaning as commonly understood by one of ordinary skill in the art to which the present inventive concept pertains. It will be further understood that terms, such as those defined in commonly used dictionaries, should be interpreted as having a meaning that is consistent with their meaning in the context of the related art, and should not be interpreted as having ideal or excessively formal meanings unless it is clearly defined in the specification.

FIG. 1 is a block diagram of a semiconductor memory device 100 according to an exemplary embodiment. Referring to FIG. 1, the semiconductor memory device 100 according to an exemplary embodiment includes a memory cell array 110 that is configured of a plurality of memory cells (not shown) storing data. The semiconductor memory device 100 according to an exemplary embodiment may be a flash memory device. In particular, the semiconductor memory device 100 according to an exemplary embodiment may be a NAND flash memory device. In this case, the memory cell array 110 may include a plurality of strings (not shown) which connect the plurality of memory cells to bit lines BL. Also, the plurality of memory cells may each store at least one bit of data. Furthermore, the plurality of memory cells may be multi-level cells or triple level cells. If the plurality of memory cells are multi-level cells, each memory cell may have up to four states, and if the plurality of memory cells are triple level cells, each memory cell may have up to eight states. Hereinafter, an exemplary embodiment of the present inventive concept will be mainly described with the assumption that the plurality of memory cells are multi-level cells. However, the present inventive concept is not limited thereto, and the plurality of memory cells may be triple level cells and store a plurality of bits, for example, 4 or more.

When the semiconductor memory device 100 according to an exemplary embodiment needs to verify a programmed state of a memory cell of the memory cell array 110, the semiconductor memory device 100 applies a verification voltage Vv to a word line that is connected to the memory cell to be verified and performs a sensing operation. A sensor 160 that performs the sensing operation described above is included in the semiconductor memory device 100. If the semiconductor memory device 100 according to an exemplary embodiment is a flash memory device, the sensor 160 may be included in a page buffer (not shown).

Before sensing a bit line BL corresponding to the memory cell to be verified, the sensor 160 discharges and precharges the bit lines BL. Then, when a read command is applied, the sensor 160 develops a voltage of the bit line BL corresponding to the memory cell to be verified. Also, the sensor 160 senses a data value stored in the memory cell based on the developed voltage. The sensed value is output via a latch (not shown) included in the page buffer. FIG. 1 illustrates that sensing data SD is directly output from the sensor 160 for convenience of description. The semiconductor memory device 100 according to an exemplary embodiment of the inventive concept may further include an input/output (I/O) circuit 150 that receives the sensing data SD from the sensor 160 and output the sensing data SD.

Referring to FIG. 1, the semiconductor memory device 100 according to an exemplary embodiment further includes a condition determination unit 120. The condition determination unit 120 may compare the sensing data SD that is output from the sensor 160 with program data PD, and with respect to a comparison result, may generate an identification code ICode that represents the comparison result. The condition determination unit 120 may receive the program data PD from the I/O circuit 150 and include a register (not shown) that stores the program data PD. Alternatively, the page buffer may provide the program data PD to the condition determination unit 120. The condition determination unit 120 may compare the sensing data SD received from the sensor 160 and the program data PD. According to an exemplary embodiment of the present inventive concept, a programmed state of a memory cell may be formed by programming the program data PD. Then, the sensing data SD, which is obtained by sensing the programmed state based on the verification voltage Vv, may be compared with the program data PD. Various comparison results that may be obtained will be described in detail below.

Each threshold voltage distribution formed by a programmed memory cell is defined as a programmed state of the memory cell. Based on the number of programmed states, a bit number of the identification code ICode may be determined. For example, if the memory cell is a multi-level cell, two bits of data are stored in the memory cell, and thus, the memory cell may have four states in total. In this case, the identification code ICode may be displayed by using three bits to indicate four states. Also, according to the number of bits of data stored in the memory cell, the identification code ICode may be displayed by using the same number of bits of data, that is, two bits The semiconductor memory device 100 according to an exemplary embodiment includes a verification operation controller 131 that programs the data to the memory cell and then controls operations of verifying the programming operation. The memory cell array 110 is programmed by using an incremental step pulse programming (ISPP) method. Each programming loop may include a data programming operation and a verification operation for verifying the data programming operation. The programming loop may be performed at least once. According to exemplary embodiments of the present inventive concept, the verification operation controller 131 may be included in a control logic unit 130 that controls data writing and data reading of the semiconductor memory device 100. The verification operation controller 131 may receive an identification code ICode that is generated by performing a first verification operation for verifying an N-th programming loop. When a second verification operation for verifying an (N+1)-th programming loop is performed based on the identification code ICode, the verification operation controller 131 may adjust an initial voltage level of the verification voltage Vv before a verification operation is performed. For convenience of description, the setup operation indicates an operation of converting the verification voltage Vv from a certain level to another level, and the initial voltage level indicates an initial level of voltage that the verification voltage Vv has before the setup operation when performing a verification operation of each programming loop. The setup operation may also be referred to as boost operation.

When the verification operation controller 131 is performing a verification operation based on a comparison result between the program data PD and the sensing data SD, the verification operation controller 131 may perform a first verification control operation for adjusting an initial voltage level of the verification voltage Vv of the currently performed verification operation such that the initial level voltage level is different from the initial voltage level of the verification voltage Vv of the above-described verification operation. Also, based on the comparison result between the program data PD and the sensing data SD, the verification operation controller 131 may perform a second verification control operation for adjusting an initial voltage level to be the same as the initial voltage level of the verification voltage Vv when performing the above-described verification operation.

To control the verification operation, the verification operation controller 131 may generate a control signal CSig. According to an exemplary embodiment, the control signal CSig is a signal for controlling the initial voltage level of the verification voltage Vv. To control the initial voltage level of the verification voltage Vv, the control signal CSig may include a signal for controlling a timing of applying a program voltage Vp or the verification voltage Vv of a voltage generator 140 to the memory cell array 110. For example, the control signal CSig may be used to start the setup operation of the verification voltage Vv when the word line WL has a first voltage level. Also, based on the identification code ICode, the control signal CSig may include a signal for controlling the voltage generator 140 such that it generates the verification voltage Vv having a determined initial voltage level.

The semiconductor memory device 100 according to an exemplary embodiment includes the voltage generator 140 that generates the program voltage Vp and the verification voltage Vv and applies the program voltage Vp and the verification voltage Vv to the plurality of memory cells. The voltage generator 140 may receive the control signal CSig from the control logic unit 130 and generate the program voltage Vp or the verification voltage Vv that is applied to the plurality of memory cells. The voltage generator 140 may generate the verification voltage Vv having an initial voltage level that is based on the control signal CSig. According to the control signal CSig, the initial voltage level of the verification voltage Vv may be a verification voltage Vv1 corresponding to a first voltage level or a verification voltage Vv2 corresponding to a second voltage level. The terms "verification voltage Vv1 corresponding to the first voltage level" and "verification voltage Vv2 corresponding to the second voltage level" imply that the voltage generator 140 may adjust the initial voltage level of the verification voltage Vv to various levels. The terms should not be interpreted as limiting the initial voltage level of the verification voltage Vv to the first voltage level or the second voltage level. Therefore, the first voltage level and the second voltage level may correspond to various voltage levels.

The verification voltage Vv, which has an initial voltage level that is determined according to the control signal CSig, may be boosted to a voltage level that is necessary for the verification operation for a predetermined amount of time. As the verification voltage Vv is boosted, the verification voltage Vv may be applied to the memory cell array 110. The verification operation controller 131 may control a timing of applying the program voltage Vp or the verification voltage Vv generated by the voltage generator 140 to a memory cell by using the control signal CSig, and control the voltage generator 140 such that the verification voltage Vv having a determined initial voltage level is generated based on the identification code ICode. The processes above will be described in detail below.

Figure 2A:
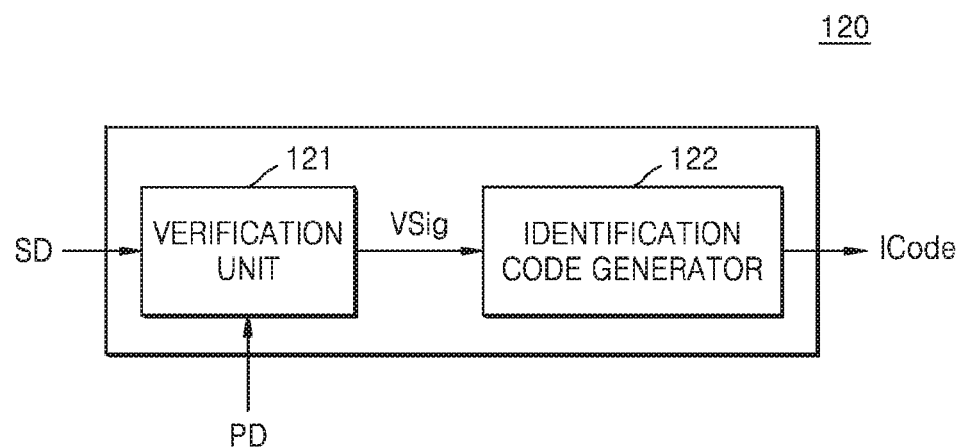
FIG. 2A is a detailed block diagram of a condition determination unit of FIG. 1 according to an exemplary embodiment.

FIG. 2A is a detailed block diagram of the condition determination unit 120 of FIG. 1 according to an exemplary embodiment. Referring to FIGS. 1 and 2A, according to an exemplary embodiment of the present inventive concept, the condition determination unit 120 may include a verification unit 121 and an identification code generator 122. The verification unit 121 may compare the sensing data SD received from the sensor 160 and the program data PD received from the outside and perform verification. The verification unit 121 may include a register (not shown) that stores the program data PD, and may further include a comparison logic circuit, for example, an XOR gate, to compare the program data PD and the sensing data SD. The verification unit 121 may apply a verification result signal VSig that is generated based on the comparison result to the identification code generator 122. The identification code generator 122 may generate the identification code ICode based on the comparison result between the program data PD and the sensing data SD. The identification code ICode may be bit data, and the number of bits of the identification code ICode may be determined based on a state of a memory cell. The identification code generator 122 provides the identification code ICode to the control logic unit 130 of FIG. 1 so that the verification operation may be controlled based on the identification code ICode.

Figure 2B:
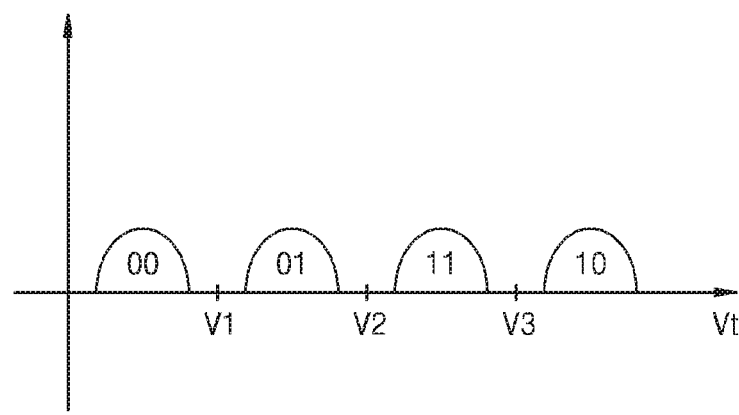
FIG. 2B is a diagram of an example of generating an identification code by using an identification code generator of FIG. 2A.

FIG. 2B is a diagram of an example of generating the identification code ICode by using the identification code generator 122 of FIG. 2A. According to an exemplary embodiment of the present inventive concept, if the plurality of memory cells are multi-level cells that store two bits of data, a memory cell to which "00" is programmed has a first state, a memory cell to which "01" is programmed has a second state, a memory cell to which "11" is programmed has a third state, and a memory cell to which "10" is programmed has a fourth state. After comparing the sensing data SD obtained by sensing the memory cell having the first state with the program data PD, if the sensing data SD obtained by sensing the memory cell having the first state is the same as the program data PD, a first code fv1 of the identification code ICode has a value of "1" to indicate that the first state of the first memory cell is verified. However, if the sensing data SD and the program data PD are not the same, the first code fv1 has a value of "0" to indicate that the first state is not verified. The first code fv1, a second code fv2, and a third code fv3 configure the identification code ICode, and the first code fv1 may be the highest bit and the third code fv3 may be the lowest bit. That is, the identification code ICode may have a value of "100" when the first state is verified by performing an N-th programming loop of programming loops including programming operations and verification operations.

After performing an M-th programming loop, if a comparison result between the sensing data SD of the memory cells having the first and second states and the program data PD shows that the sensing data SD is the same as the program data PD, this indicates that the first and second states of the memory cells are verified, and thus, the identification code ICode may have a value of "110." After performing an L-th programming loop, if a comparison result between the sensing data SD of the memory cells having the first, second, and third states and the program data PD shows that the sensing data SD is the same as the program data PD, this indicates that the first, second, and third states of the memory cells are verified, and thus, the identification code ICode may have a value of "111." The identification code generator 122 may provide the generated identification code ICode to the control logic unit 130. Based on the identification code ICode, the verification operation controller 131 in the control logic unit 130 may control the verification operations of the semiconductor memory device 100.

According to an exemplary embodiment, the number of bits of the identification code ICode may be determined based on the number of bits of data stored by the memory cell. For example, the identification code ICode may have a value of "00" when "00" data is verified, the identification code ICode may have a value of "01" when "01" data is verified, and the identification code ICode may have a value of "11" when "11" data is verified. Also, the identification code ICode may have a value of "10" when "10" data is verified. Also, the identification code generator 122 and the verification unit 121 may be combined as a single unit. Even when the plurality of memory cells are triple level cells that may store at least two bits of program data, exemplary embodiments of the present inventive concept may be applied.

Figure 3:
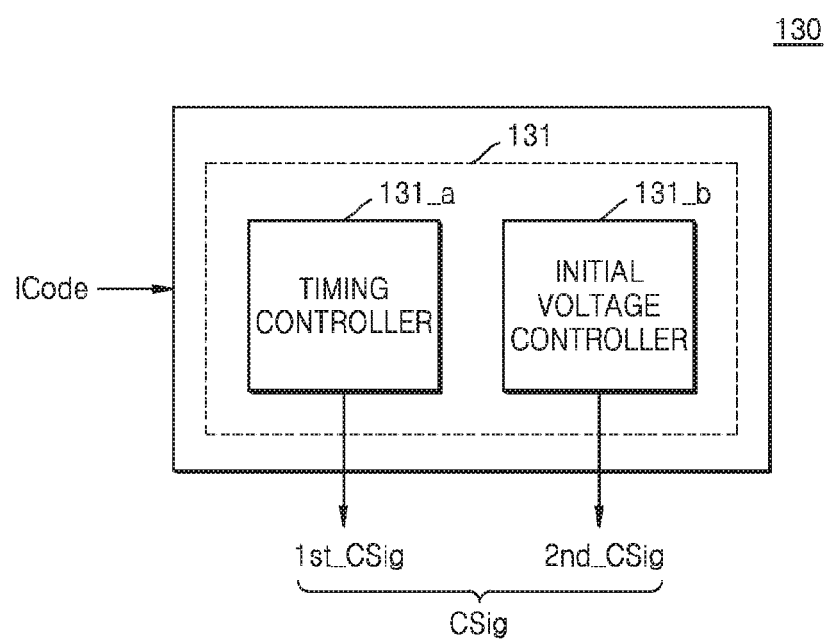
FIG. 3 is a detailed block diagram of a control logic unit of FIG. 1.

FIG. 3 is a detailed diagram of the control logic unit 130 of FIG. 1. Referring to FIG. 3, the control logic unit 130 includes the verification operation controller 131, and the verification operation controller 131 may include a timing controller 131_a and an initial voltage controller 131_b. The timing controller 131_a may generate a first control signal $1^{st}$_CSig based on the identification code ICode received from the programming loops including the programming operations and the verification operations, and control a timing of when the voltage generator 140 applies the program voltage Vp and the verification voltage Vv to the memory cell. The initial voltage controller 131_b may generate a second control signal $2^{nd}$_CSig, and adjust the initial voltage level of the verification voltage Vv based on the identification code ICode. According to an exemplary embodiment, the initial voltage controller 131_b may set a first initial voltage level Vv1 and the voltage generator 140 may be controlled such that the first initial voltage level Vv1 is generated in advance. According to an exemplary embodiment, based on the identification code ICode, the initial voltage controller 131_b may control the voltage generator 140 such that a determined initial voltage level of the verification voltage Vv is generated in advance. Also, the timing controller 131_a and the initial voltage controller 131_b may be configured as a single unit. Also, the first control signal 1$^{st}$_CSig and the second control signal 2$^{nd}$_CSig may be included in the control signal CSig.

FIGS. 4A to 4D are graphs regarding verification operations performed on memory cells having a multi-level cell property, according to an exemplary embodiment. Since the verification operations are performed by a semiconductor memory device including elements and features of FIGS. 2A, 2B, and 3, the present exemplary embodiment will be described based on the elements and features shown in FIGS. 2A, 2B, and 3.

Figure 4A:
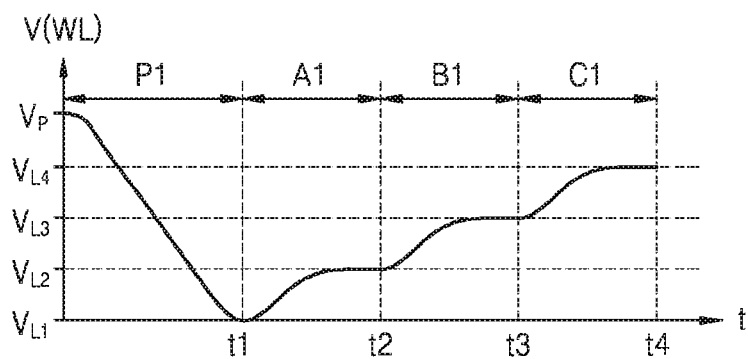
FIGS. 4A to 4D are graphs regarding verification operations performed on memory cells having a multi-level cell property, according to an exemplary embodiment.

FIG. 4A shows an example in which a general programming loop or the identification code ICode is "000." Since memory cells of a multi-level cell each have four states, three levels of verification voltages Vv are required to verify each state, and a verification voltage Vv is applied at a level required according to a memory cell that is to be verified. A program voltage Vp is applied before a first time t1. In a period A1 between the first time t1 and a second time t2, an initial voltage level of the verification voltage Vv is set at a first level VL1, the verification voltage Vv is boosted from the first level VL1 to a second level VL2, and a verification operation of a first state of the memory cell is performed. Next, in a period B1, the initial voltage level of the verification voltage Vv is set at the second level VL2, the verification voltage Vv is boosted from the second level VL2 to a third level VL3, and a verification operation of a second state of the memory cell is performed. Next, in a period C1, the initial voltage level of the verification voltage Vv is set to the third level VL3, the verification voltage Vv is boosted from the third level VL3 to a fourth level VL4, and a verification operation of third and fourth states of the memory cell is performed.

Figure 4B:
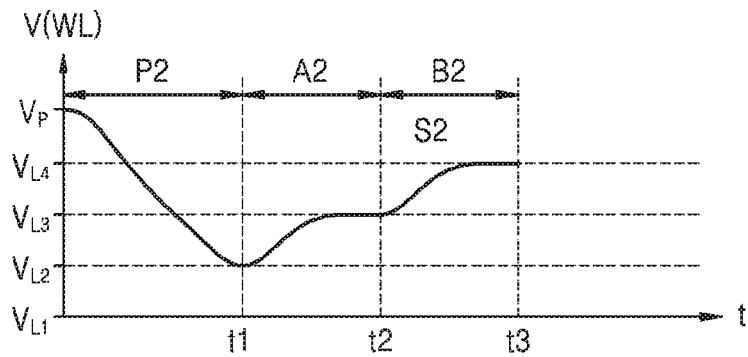

FIG. 4B shows a verification operation controlled by the verification operation controller 131 of FIG. 3 when the identification code ICode is "100" after a programming loop shown in FIG. 4A. When the identification code ICode is "100," if the verification operation of the first state described with reference to FIG. 2B is complete, that is, after comparing the program data PD with respect to "00" with the sensing data SD obtained by sensing "00" of FIG. 2B, if the program data PD and the sensing data SD with respect to "00" are the same, the verification operation of the first state is not necessary. In this case, the initial voltage controller 131_b may set the initial voltage level of the verification voltage Vv for verifying the second state at the second level VL2. Also, the initial voltage controller 131_b may control the voltage generator 140 so that the verification voltage Vv to be boosted from the second level VL2 is generated. That is, the voltage generator 140 may be controlled so that the verification voltage Vv having an initial voltage level equal to the second level VL2 may be generated in advance. When the program voltage Vp is reduced to the second level VL2, the timing controller 131_a may control the voltage generator 140 so that the verification voltage Vv having an initial voltage level equal to the second level VL2 is generated and applied to the word line WL. Then, the verification voltage Vv for verifying the second state may be applied to the word line WL while the initial voltage level of the verification voltage Vv is being boosted from the second level VL2 to the third level VL3, that is, during a period A2. A verification operation performed in the period C1 of FIG. 4A may also be performed in a period B2.

Figure 4C:
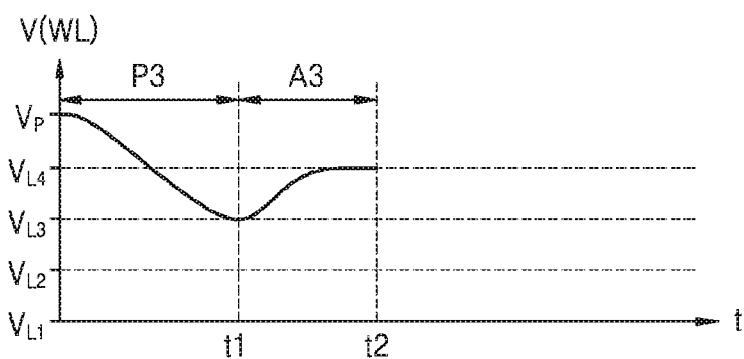

FIG. 4C shows a verification operation controlled by the verification operation controller 131 of FIG. 3 when the identification code ICode is "110" after the programming loop shown in FIG. 4A or a programming loop shown in FIG. 4B. When the identification code ICode is "110," if the verification operations of the first and seconds states described with reference to FIG. 2B are complete, that is, when the program data PD with respect to "00" and "01" is the same as the sensing data SD obtained by sensing "00" and "01" of FIG. 2B, the verification operations of the first and second states are not necessary. In this case, the initial voltage controller 131_b may set the initial voltage level of the verification voltage Vv for verifying the third state to the third level VL3. Also, the initial voltage controller 131_b may control the voltage generator 140 so that the verification voltage Vv to be boosted from the third level VL3 is generated. When the program voltage Vp is reduced to the third level VL3, the timing controller 131_a may control the voltage generator 140 so that the verification voltage Vv having an initial voltage level equal to the third level VL3 is generated in a period A3 and applied to the word line WL. Then, the verification voltage Vv for verifying the third state may be applied to the word line WL while the initial voltage level of the verification voltage Vv is being boosted from the third level VL3 to the fourth level VL4, that is, during the period A3.

Figure 4D:
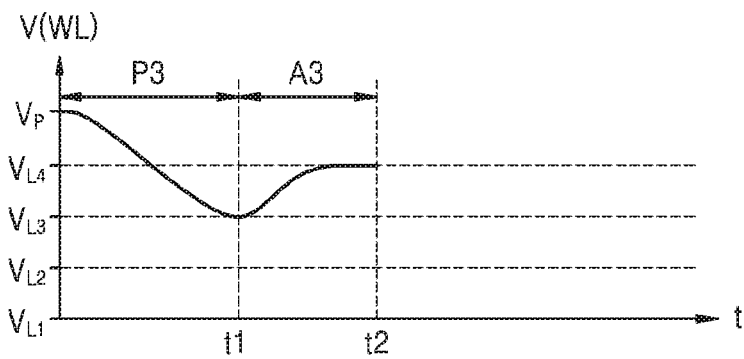

FIG. 4D shows a verification operation controlled by the operation controller 131 of FIG. 3 when the identification code ICode is "111" after the programming loops shown in FIG. 4A. When the identification code ICode is "111," if the verification operations of the first to third states described with reference to FIG. 2B are complete, that is, when the program data PD with respect to "00," "01," and "11" is the same as the sensing data SD obtained by sensing "00," "01," and "11" of FIG. 2B, the verification operations of the first to third second states are not necessary. In this case, the initial voltage controller 131_b may set the initial voltage level of the verification voltage Vv for verifying the fourth state to the third level VL3. Also, the initial voltage controller 131_b may control the voltage generator 140 so that the verification voltage Vv to be boosted from the third level VL3 is generated. When the program voltage Vp is reduced to the third level VL3, the timing controller 131_a may control the voltage generator 140 so that the verification voltage Vv having an initial voltage level equal to the third level VL3 in a period A4 and applied to the word line WL. Then, the verification voltage Vv for verifying the fourth state may be applied to the word line WL while the initial voltage level of the verification voltage Vv is being boosted from the third level VL3 to the fourth level VL4, that is, during the period A4. However, this is only an exemplary embodiment, and the initial voltage level of the verification voltage Vv may be set to the second level VL2, the verification voltage Vv may be boosted to the fourth level VL4, and then, the verification operation may be performed.

The terms "first level VL1" and "second level VL2" are different from the terms "first voltage level" and "second voltage level" disclosed in FIG. 1. The first voltage level and the second voltage level of FIG. 1 may correspond to various levels, for example, to any one selected from the first level VL1, the second level VL2, the third level VL3 and the fourth level VL4. According to an exemplary embodiment, the verification operation controller 131 may set the first voltage level and the second voltage level as any one selected from the first level VL1, the second level VL2, the third level VL3 and the fourth level VL4. However, this is only an exemplary embodiment, a semiconductor memory device including memory cells having a triple level cell property may have more than four levels described above, and exemplary embodiments of the present inventive concept may be applied thereto.

FIGS. 5A to 5D are graphs regarding setup periods according to an exemplary embodiment. Referring to FIGS. 5A to 5D, a "first setup period S1" indicates an amount of time required to boost the verification voltage Vv from the first level VL1 to the second level VL2 in the period A1. A "second setup period S2" indicates an amount of time required to boost the verification voltage Vv from the second level VL2 to the third level VL3 period B1. A "third setup period S3" indicates an amount of time required to boost the verification voltage Vv from the third level VL3 to the fourth level VL4 in the period C1. The first to third setup periods S1 to S3 may have the same or similar values.

Figure 5A:
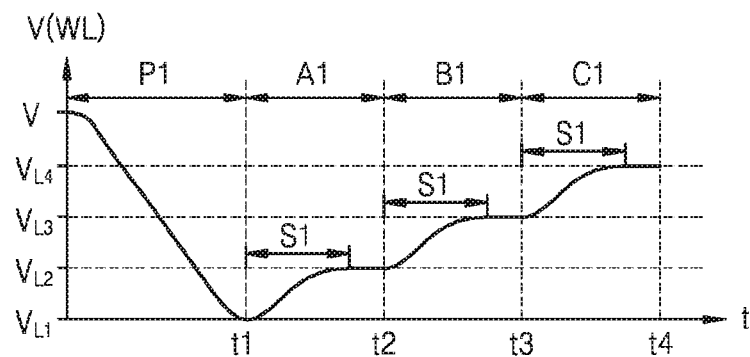
FIGS. 5A to 5D are graphs regarding setup periods according to an exemplary embodiment.
Figure 5B:
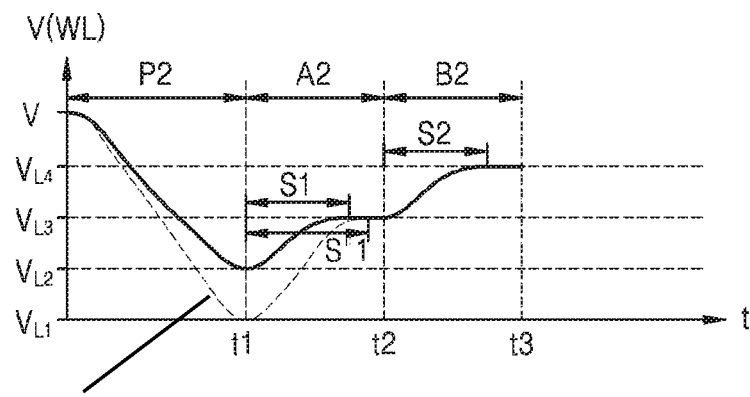
Figure 5C:
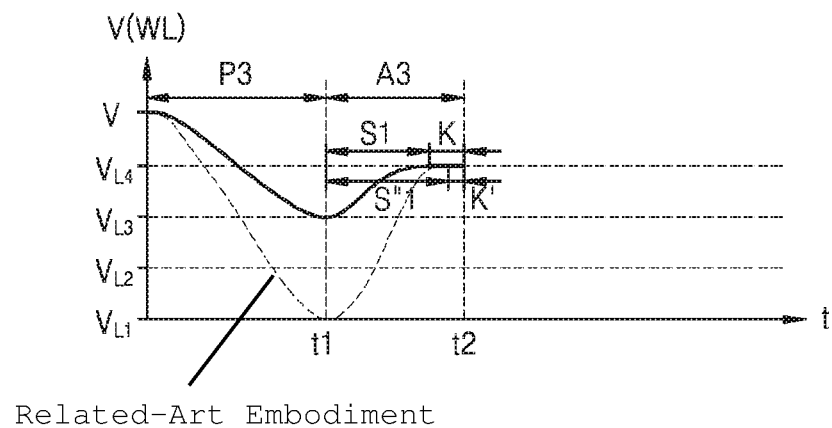

In FIG. 5B the verification operation of the first state is complete when the identification code ICode is "100" as described in FIG. 4B, and thus, the verification voltage Vv having the second level VL2 that is necessary to verify the first state is not required. In the related art, the initial voltage level of the verification voltage Vv is set to the first level VL1 and the verification voltage Vv is boosted to the third level VL3 during a first setup period" S"1. According to an exemplary embodiment of the present inventive concept, the initial voltage level of the verification voltage Vv is set to the second level VL2, and the verification voltage Vv is boosted to the third level VL3 during the first setup period S1. In this case, the first setup period S1 may be the same as the first setup period S1 of FIG. 5A, and the first setup period" S"1 may be longer than the first setup period S1. According to the related art and an exemplary embodiment of the present inventive concept, a period B2 may include a second setup period S2. In the related art, the first setup period" S"1 of a period A2 may be different from the second setup period S2 of the period B2, and thus, a semiconductor memory device may be deteriorated. According to an exemplary embodiment of the present inventive concept, the initial voltage level of the verification voltage Vv is controlled so that the first setup period S1 of the period A2 is the same as or similar to the second setup period S2 of the period B2, and thus, the semiconductor memory device may be prevented from being deteriorated. In FIG. 5C the verification operations of the first and second states are complete when the identification code ICode is "110" as described in FIG. 4C, and thus, the verification voltage Vv having the second level VL2 and the third level VL3 that are necessary to verify the first and second states is not required. In the related art, the initial voltage level of the verification voltage Vv is set to the first level VL1, and a setup operation for converting the verification voltage Vv to the fourth level VL4 is performed during the first setup period" S"1. According to an exemplary embodiment of the present inventive concept, the initial voltage level of the verification voltage Vv is set to the third level VL3, and a setup operation for converting the verification voltage Vv to the fourth level VL4 may be performed during the first setup period S1. The first setup period S1 may be the same as the first setup period S1 of FIG. 5A, and the first setup period" S"1 may be longer than the first setup period S1. According to an exemplary embodiment of the present inventive concept, the first setup period S1 of a period A3 may be shorter than the first setup period" S"1, and thus, a first verification time K according to an exemplary embodiment of the present inventive concept, during which a verification operation is performed on the verification voltage Vv having the fourth level VL4, may be longer than a second verification time K' of the related art. Therefore, reliability of the semiconductor memory device is improved.

Figure 5D:
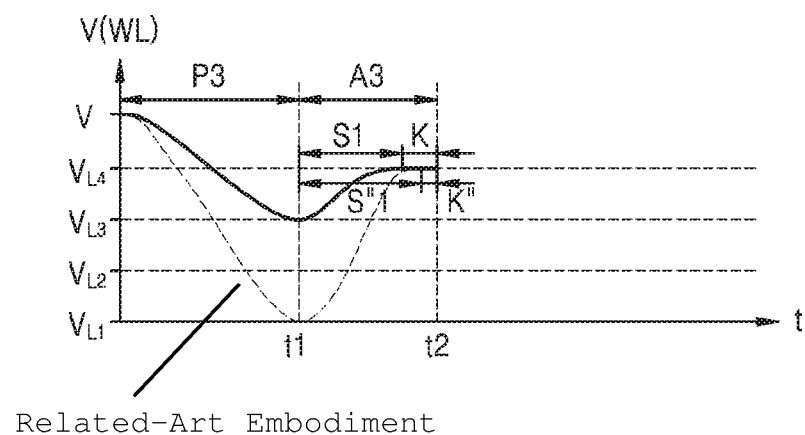

In FIG. 5D the verification operations of the first to third states are complete when the identification code ICode is "111" as described with reference to FIG. 4 and thus the verification voltage Vv having the second level VL2 and the third level VL3 that are necessary to verify the first and second states is not required. According to an exemplary embodiment, the initial voltage level of the verification voltage Vv is set to the third level VL3 and a setup operation for converting the verification voltage Vv to the fourth level VL4 may be performed during the first setup period S1 as in FIG. 5C. The effect of this process is described above with reference to FIG. 5C. However exemplary embodiments of the effect are not limited thereto. According to another exemplary embodiment, when the identification code ICode is "111" the initial voltage level of the verification voltage Vv is set to the fourth level VL4 and thus the verification operations may be performed without requiring a separate setup time by using the verification voltage Vv having the fourth level VL4.

Figure 6:
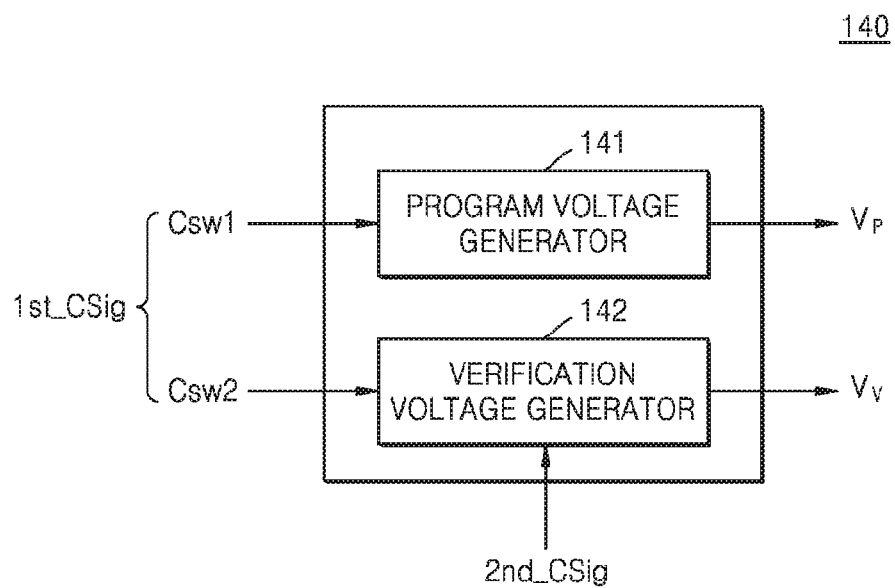
FIG. 6 is a detailed block diagram of a voltage generator of FIG. 1.

FIG. 6 is a detailed diagram of the voltage generator 140 of FIG. 1. Referring to FIG. 6, the voltage generator 140 may include a program voltage generator 141 and a verification voltage generator 142. The program voltage generator 141 may apply the program voltage Vp to a memory cell when a programming operation is performed during a programming loop. The verification voltage generator 142 may apply the verification voltage Vv to the memory cell when a verification operation is performed during the programming loop. The voltage generator 140 may receive the first control signal $1^{st}$_CSig and the second control signal $2^{nd}$_CSig generated by the verification operation controller 131 of FIG. 3. The first control signal $1^{st}$_CSig may include a first timing control signal Csw1 for controlling a timing of applying the program voltage Vp and a second timing control signal Csw2 for controlling a timing of applying the verification voltage Vv.

Hereinafter, detailed operations of the program voltage generator 141 and the verification voltage generator 142 will be described. Referring to FIGS. 4A and 4B, when the identification code ICode is "100" after the programming loop shown in FIG. 4A is performed, the verification voltage generator 142 may receive the second control signal $2^{nd}$_CSig and generate the verification voltage Vv having the initial voltage level corresponding to the second level VL2 in advance. The program voltage generator 141 may receive the first timing control signal Csw1, and when the program voltage Vp is reduced to the second level VL2, disable the program voltage Vp that was applied to the memory cell by the program voltage generator 141. Then, the verification voltage generator 142 may receive the second timing control signal Csw2, and apply the verification voltage Vv having the initial voltage level corresponding to the second level VL2, which was generated in advance by the verification voltage generator 142, to the memory cell. The verification voltage generator 142 may perform a setup operation for converting the verification voltage Vv from the second level VL2 to the third level VL3. This is only an exemplary embodiment of the present inventive concept, and the detailed operations of the program voltage generator 141 and the verification voltage generator 142 may be applied to verification operations other than the above-described verification operation that is performed when the identification code ICode is "100." Also, the program voltage generator 141 and the verification voltage generator 142 may be combined as a single unit and operate.

Figure 7:
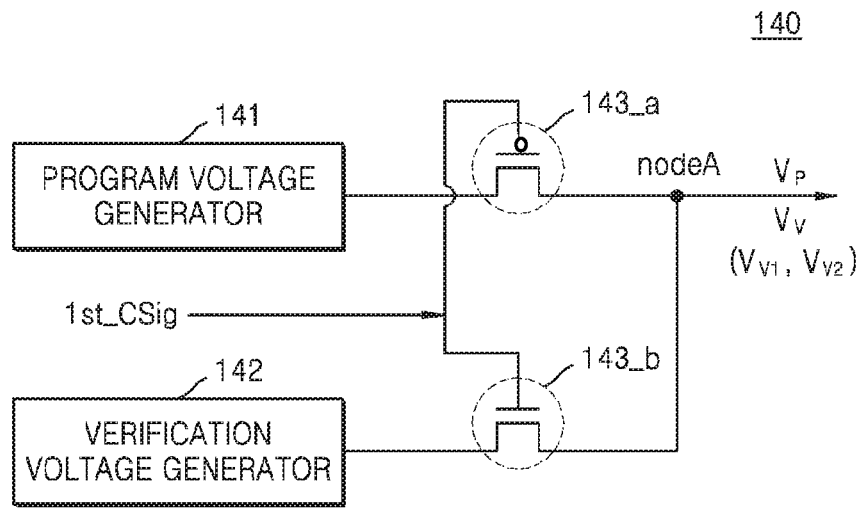
FIG. 7 is a schematic diagram of a voltage generator being controlled by a first control signal.

FIG. 7 is a diagram of the voltage generator 140 being controlled by a first control signal $1^{st}$_CSig. Referring to FIG. 7, the program voltage generator 141 and the verification voltage generator 142 may be electrically connected to the memory cell at a node A. The node A and the program voltage generator 141, and the node A and the verification voltage generator 142 may be connected by a switch device, respectively. According to an exemplary embodiment of the present inventive concept, the program voltage generator 141 may be connected to a PMOS transistor 143_a and the verification voltage generator 142 may be connected to a NMOS transistor 143_b as the switch device.

Unlike FIG. 6, the first control signal $1^{st}$_CSig is a single signal, and an apply timing of the program voltage Vp by the program voltage generator 141 and an apply timing of supplying the verification voltage Vv by the verification voltage generator 142 may be controlled according to the first control signal $1^{st}$_CSig. For example, when the first control signal $1^{st}$_CSig is "0," the PMOS transistor 143_a is enabled and may apply the program voltage Vp generated by the program voltage generator 141 to the memory cell. The NMOS transistor 143_b is disabled, and the verification voltage generator 142 and the memory cell may be electrically disconnected.

When the first control signal $1^{st}$_CSig is "1", the PMOS transistor 143_a is disabled and the program voltage generator 141 and the memory cell may be disconnected. The NMOS transistor 143_b is enabled and may apply the verification voltage Vv generated by the verification voltage generator 142 to the memory cell. However, this is only an exemplary embodiment, and respective positions of the PMOS transistor 143_a and the NMOS transistor 143_b may be opposite. Furthermore, the PMOS transistor 143_a and the NMOS transistor 143_b may be other types of switch devices.

Figure 8:
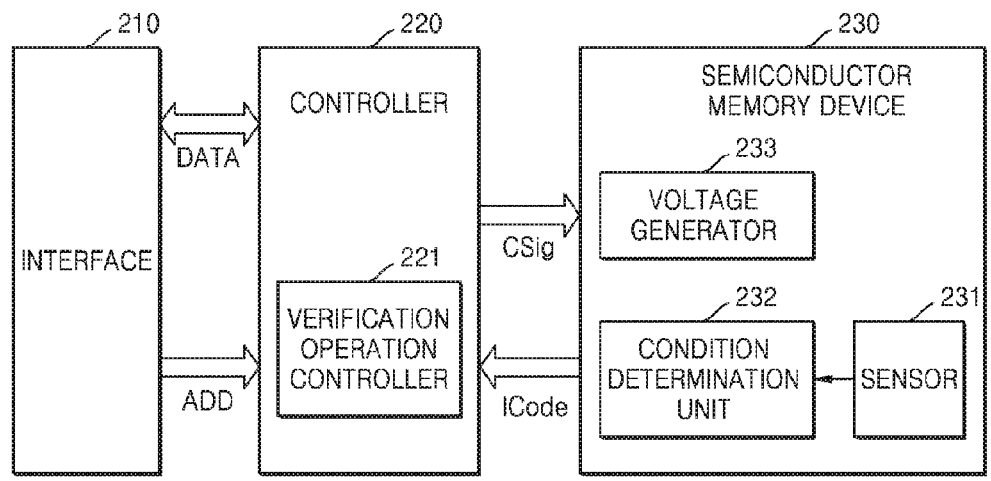
FIG. 8 is a block diagram of a semiconductor memory system according to an exemplary embodiment.

FIG. 8 is a block diagram of a semiconductor memory system 200 according to an exemplary embodiment. Referring to FIG. 8, the semiconductor memory system 200 may include an interface 210, a controller 220, and a semiconductor memory device 230. The interface 210 may provide an interface for the semiconductor memory system 200 and a host. The interface 210 may include a data exchange protocol that corresponds to the host to interface with the host. The interface 210 may be configured to communicate with the host via any one of various interface protocols, for example, universal serial bus (USB), multi-media card (MMC), peripheral component interconnect-express (PCI-E), serial-attached SCSI (SAS), serial advanced technology attachment (SATA), parallel advanced technology attachment (PATA), small computer system interface (SCSI), enhanced small disk interface (ESDI), or integrated drive electronics (IDE).

The controller 220 may include a verification operation controller 221 that controls a verification operation by setting an initial voltage level of a verification voltage to a first voltage level and boosting the verification voltage for a predetermined time, in a programming loop that includes performing a programming operation and the verification operation with respect to a memory cell of the semiconductor memory device 230. The semiconductor memory device 230 may include a sensor 231 that generates sensing data SD by sensing the memory cell, a condition determination unit 232 that compares the sensing data SD and program data PD and generates an identification code ICode based on the comparison result, and a voltage generator 233 that generates a program voltage Vp and a verification voltage Vv.

The condition determination unit 232 may provide the identification code ICode to the verification operation controller 221. When at least one state of the memory cell is verified based on the comparison result between the sensing data SD and the program data PD, the verification operation controller 221 may control the verification operation by setting the initial voltage level of the verification voltage Vv to a second voltage level, and then boosting the verification voltage Vv to a level that is necessary for the verification operation.

According to an exemplary embodiment of the present inventive concept, a second voltage level may be higher than a second voltage level, and a time necessary for boosting the verification voltage Vv having a certain level may be reduced when an initial voltage level of the verification voltage Vv is set to the second voltage level, and thus, reliability of the semiconductor memory system 200 may be improved. However, if a result of a verification operation of an (N−1)-th programming loop is the same as a result of a verification operation of an (N−2)-th programming loop, a verification operation of an N-th programming loop may be controlled by setting the initial voltage level of the verification voltage Vv to the first voltage level and boosting the verification voltage for a certain amount of time. Also, if none of the states of the memory cell are verified, a verification operation of the programming loop may be controlled by setting the initial voltage level of the verification voltage Vv to the first voltage level and then boosting the verification voltage Vv to a level necessary for performing the verification operation.

The verification operation controller 221 may provide the control signal CSig to the semiconductor memory device 230. Based on the control signal CSig, the verification operation controller 221 may control a timing of when the voltage generator 223 applies the program voltage Vp and the verification voltage Vv to the memory cell, and the setting of the initial voltage level of the verification voltage Vv.

Figure 9:
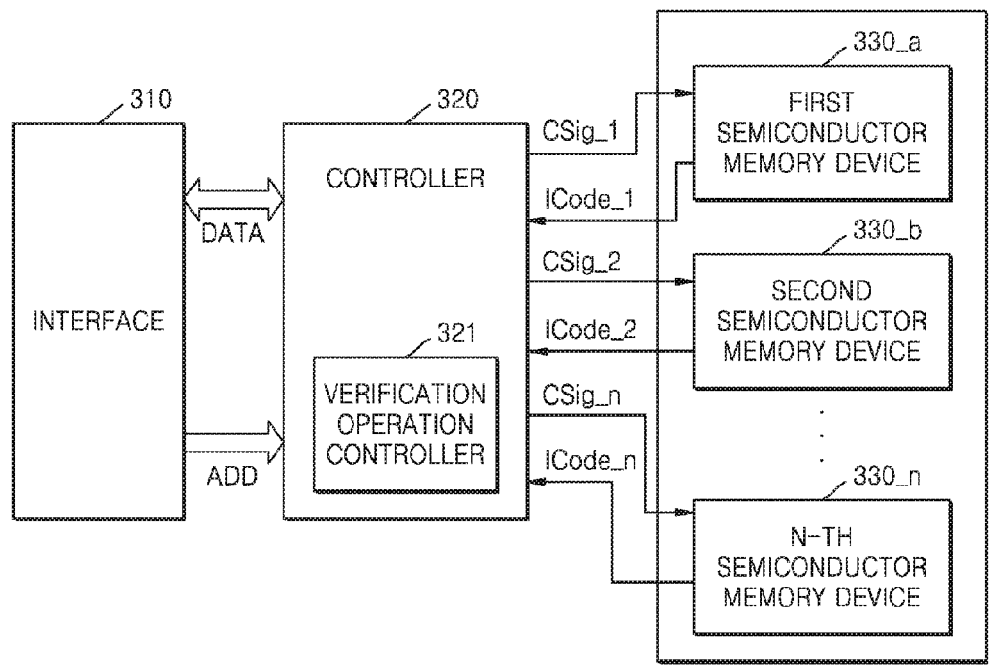
FIG. 9 is a detailed block diagram of a semiconductor memory system.

FIG. 9 is a detailed block diagram of a semiconductor memory system 300. Referring to FIG. 9, a semiconductor memory device group 330 may include a plurality of semiconductor memory devices 330_a to 330_n. A controller 320 may include a verification operation controller 321. A first semiconductor memory device 330_a may provide a first identification code ICode_1 to the controller 320. The verification operation controller 321 may provide a first control signal CSig_1 to the first semiconductor memory device 330_a based on the first identification code ICode_1, and thus control a verification operation. Likewise, the verification operation controller 321 may receive identification codes ICode_b to ICode_n respectively from second to n-th semiconductor memory devices 330_b to 330_n. Second to n-th control signals CSig_2 to CSig_n may be generated based on the received identification codes ICode_b to ICode_n and respectively provided to the second to n-th semiconductor memory devices 330_b to 330_n. Therefore, reliability of the semiconductor memory system 300 may be improved by performing programming loops of the plurality of semiconductor memory devices 330_a to 330_n. Also, verification speed may be increased. The detailed description of the programming loops is omitted because it is provided above.

Figure 10:
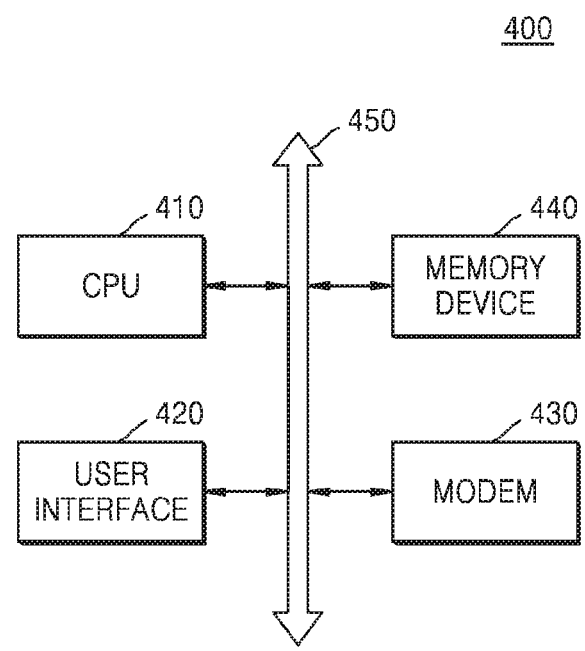
FIG. 10 is a block diagram of a computer system including semiconductor devices according to some exemplary embodiments.

FIG. 10 is a block diagram of a computer system 400 including semiconductor devices according to some exemplary embodiments. Referring to FIG. 10, the computer system 400 may include a central processing unit (CPU) 410, a user interface 420, a semiconductor memory device 440, and a modem 430 such as a baseband chipset, which are electrically connected to a system bus 450. The user interface 420 may transmit data to or receive data from a communication network. The user interface 420 may be wired or wireless, and may include an antenna or a wired or wireless transceiver. Data provided by the user interface 420 or the modem 430 or processed by the CPU 410 may be stored in the semiconductor memory device 440.

The semiconductor memory device 440 may include a volatile memory device, such as DRAM, and/or a non-volatile memory device, such as flash memory. The semiconductor memory device 440 may include the verification operation controller 131 and the condition determination unit 120 according to some exemplary embodiments of the present inventive concept, as shown in FIG. 1. Thus, when the semiconductor memory device 440 performs a verification operation, the initial voltage level of the verification voltage Vv may be controlled so that reliability of the semiconductor memory device 440 is improved and deterioration of memory cells is reduced or prevented.

If the computer system 400 according to an exemplary embodiment of the present inventive concept is a mobile device, a battery (not shown) for supplying an operation voltage of the computer system 400 will be additionally provided. Although not illustrated in FIG. 10, computer system 400 according to an exemplary embodiment of the present inventive concept may further include an application chipset, a camera image processor (CIP), and an input/output (I/O) device.

If the computer system 400 according to an exemplary embodiment of the present inventive concept is a wireless communication device, the computer system 400 may be used in communication systems such as Code Division Multiple Access (CDMA), Global System for Mobile communication (GSM), North American Multiple Access (NADC), and CDMA2000.

Figure 11:
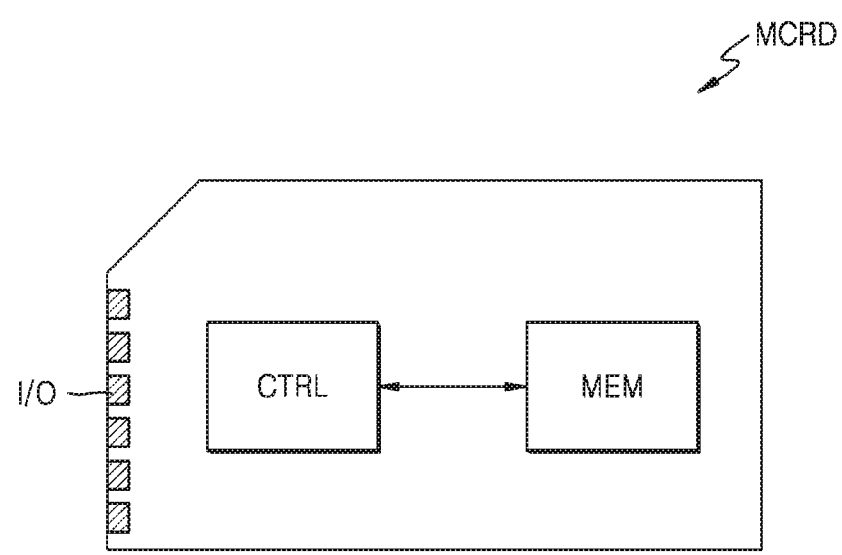
FIG. 11 is a block diagram of a memory card according to an exemplary embodiment.

FIG. 11 is a block diagram of a memory card MCRD according to an exemplary embodiment. Referring to FIG. 11, the memory card MCRD according to an exemplary embodiment includes a memory controller CTRL and a memory device MEM. The memory device MEM may include a semiconductor memory device according to some exemplary embodiments of the present inventive concept. The memory controller CTRL responds to a request from an external host received via an I/O device I/O, and thus controls writing of data into the memory device MEM or data sensing of the memory device MEM. Also, if the memory device MEM of FIG. 11 is a flash memory device, the memory controller CTRL controls a removing operation regarding the memory device MEM. The memory controller CTRL of the memory card MCRD according to an exemplary embodiment may include interfaces that interface with the host and the memory device MEM and RAM to perform the above-described control operations. The memory device MEM of the memory card MCRD according to an embodiment may include the semiconductor memory device 100 of FIG. 1.

The memory card MCRD of FIG. 11 may be a Compact Flash Card (CFC), a Microdrive, a Smart Media Card (SMC), a Multimedia Card (MMC), a Security Digital Card (SDC), a Memory Stick, or a USB flash memory driver.

Figure 12:
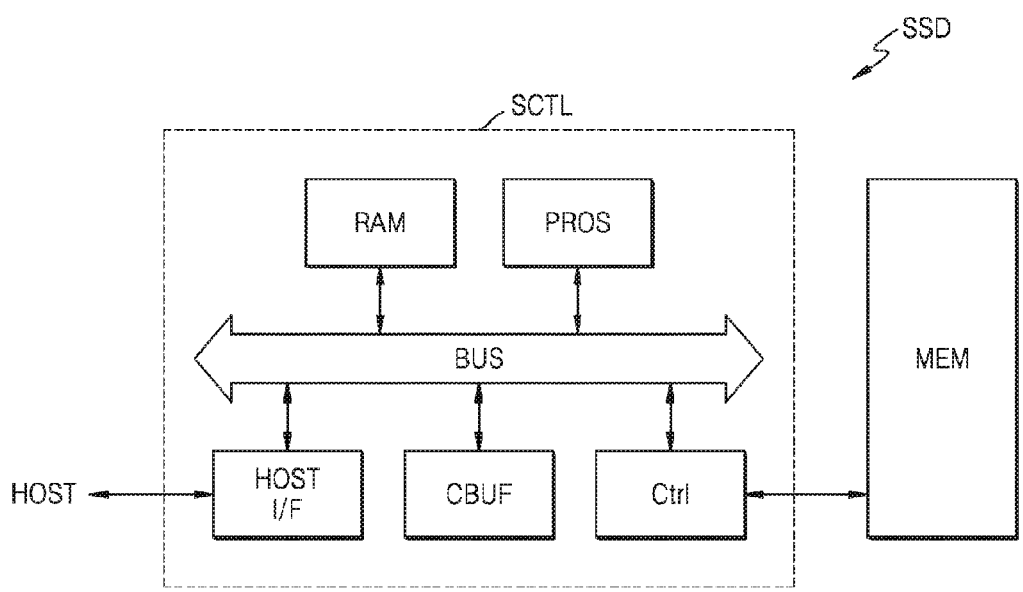
FIG. 12 is a diagram of an example in which a semiconductor storage system according to an exemplary embodiment is a solid state drive (SSD)

FIG. 12 is a diagram of an example in which a semiconductor storage system according to an exemplary embodiment is a solid state drive (SSD) SSD. Referring to FIG. 12, the according to an exemplary embodiment the SSD SSD includes an SSD controller SCTL and a memory device MEM. The memory device MEM may include the semiconductor memory device 100 of FIG. 1 according to an exemplary embodiment of the present inventive concept. The SSD controller SCTL may include a processor PROS, a Random Access Memory RAM, a cache buffer CBUF, and a memory controller CTRL that are connected by a bus BUS.

The processor PROS controls such that the memory controller CTRL transmits and receives data to and from the memory device MEM in response to a request (command, address, or data) of a host. According to an exemplary embodiment, the processor PROS and the memory controller CTRL of the SSD SSD may be a single ARM processor. Data required for operations of the processor PROS may be loaded in the RAM RAM.

A host interface HOST I/F may receive the request of the host and transmit the request to the processor PROS, or transmit data that is transmitted from the memory device MEM to the host. The host interface HOST I/F may be any one of various interface protocols, for example, a USB, a Multi Media Card (MMC), PCI-E, SATA, PATA, SCSI, ESDI, or IDE. Data to be transmitted to the memory device MEM or transmitted from the memory device MEM may be temporarily stored in the cache buffer CBUF. The cache buffer CBUF may be an SRAM.

The above-described semiconductor memory devices according to an exemplary embodiment may be mounted by using various forms of packages. For example, the semiconductor memory devices may be mounted by using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 13:
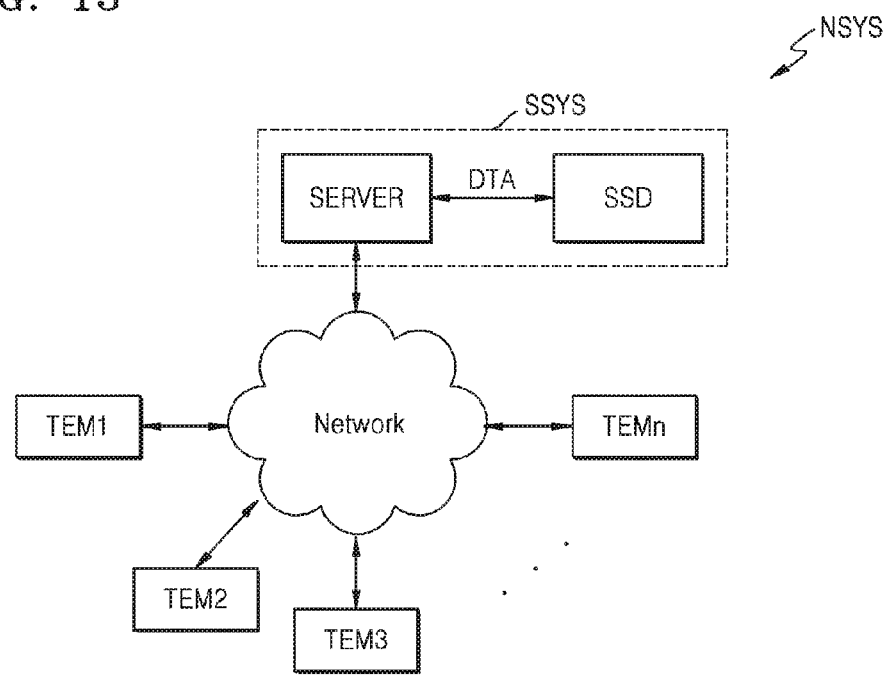
FIG. 13 is a diagram of a server system and a network system including a semiconductor storage system, according to an exemplary embodiment.

FIG. 13 is a diagram of a server system SSYS and a network system NSYS including the semiconductor storage system of FIG. 12, according to an exemplary embodiment. Referring to FIG. 13, the network system NSYS according to an exemplary embodiment may include the server system SSYS connected via a network and a plurality of terminals TEM1 to TEMn. The server system SSYS according to an exemplary embodiment may include a server SERVER that processes requests received from the plurality of terminals TEM1 to TEMn that are connected to the network and an SSD SSD that stores data corresponding to the requests from the plurality of terminals TEM1 to TEMn. The SSD SSD of FIG. 13 may be the SSD SSD of FIG. 12.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
    a memory cell array comprising a plurality of memory cells configured to store program data;
    a sensor configured to generate sensing data by sensing the program data from the memory cell array;
    a condition determination unit configured to compare the program data and the sensing data and generate a result of the comparison; and
    a control logic unit configured to selectively perform a first verification operation when the comparison result has a first value and a second verification operation when the comparison result has a second value that is different from the first value, wherein:
    the first verification operation boosts a verification voltage applied to the memory cell array, during a predetermined period, from a first voltage to a second voltage, which differs from the first voltage, and the second verification operation boosts the verification voltage applied to the memory cell array, during the predetermined period, from the second voltage to a third voltage, which differs from each of the first and second voltages.

2. The semiconductor memory device of claim 1, wherein program data stored in one memory cell of the plurality of memory cells is at least 2 bits.

3. The semiconductor memory device of claim 1, wherein the program data is programmed to the plurality of memory cells using an incremental step pulse programming (ISPP) process.

4. The semiconductor memory device of claim 1, wherein the second voltage is higher than the first voltage.

5. The semiconductor memory device of claim 1, wherein the condition determination unit comprises:
 a verification unit configured to perform the comparison of the program data and the sensing data; and
 an identification code generator configured to generate an identification code based on the result of the comparison and transmit the identification code to the control logic unit.

6. The semiconductor memory device of claim 5, wherein a number of bits of the identification code is set based on a number of types of program states stored in each of the plurality of memory cells.

7. The semiconductor memory device of claim 1, wherein:
 the control logic unit is configured to generate a control signal for setting a magnitude of the second voltage based on the comparison result; and
 the semiconductor device further comprises a voltage generator configured to set the second voltage to the magnitude indicated by the control signal and boost the verification voltage from the second voltage to the third voltage, during the predetermined period, and apply the verification voltage to a word line connected to each of the plurality of memory cells.

8. The semiconductor memory device of claim 7, wherein the voltage generator comprises:
 a program voltage generator configured to generate a program voltage when a programming operation is performed and apply the program voltage by controlling a first switch; and
 a verification voltage generator configured to generate the verification voltage when a verification operation is performed and apply the verification voltage to the word line by controlling a second switch.

9. The semiconductor memory device of claim 8, wherein the control logic unit is configured to apply the verification voltage to the word line by turning off the first switch and turning on the second switch when a voltage of the word line is reduced to the second voltage from the program voltage.

10. The semiconductor memory device of claim 8, wherein the control logic unit comprises:
 a timing controller configured to control on and off timings of the first and second switches; and
 an initial voltage controller configured to control a setting operation of an initial voltage of the verification voltage generator.

11. The semiconductor memory device of claim 10, wherein:
 when the program voltage generator generates and applies the program voltage to each of the plurality of memory cells, the timing controller turns off the first switch when the program voltage is converted to the first voltage;
 the verification voltage generator is configured to turn on the second switch when the first switch is off; and
 the initial voltage controller is configured to set the initial voltage to the first voltage.

12. The semiconductor memory device of claim 10, wherein:
 when the program voltage generator generates and applies the program voltage to each of the plurality of memory cells, the timing controller turns off the first switch when the program voltage is converted to the second voltage;
 the verification voltage generator is configured to turn on the second switch when the first switch is off; and
 the initial voltage controller is configured to set the initial voltage to the second voltage.

13. The semiconductor memory device of claim 1, wherein the semiconductor memory device is a flash memory device.

14. The semiconductor device of claim 1, wherein each of the first and second verification operations comprises sensing, with the sensor during the predetermined period, data programmed to the memory cell array using the verification voltage applied to the memory cell array.

15. A semiconductor memory device comprising:
 a control logic unit configured to selectively perform a first verification operation when a comparison result between program data and sensing data has a first value and a second verification operation when the comparison result has a second value that is different from the first value, wherein:
 the first verification operation boosts a verification voltage applied to a memory cell array, during a predetermined period, from a first voltage to a second voltage, which differs from the first voltage, and
 the second verification operation boosts the verification voltage applied to the memory cell array, during the predetermined period, from the second voltage to a third voltage, which differs from each of the first and second voltages.

16. A method executed by a semiconductor memory device, the method comprising:
 storing program data in a plurality of memory cells of a memory cell array;
 sensing the program data from the memory cell array to generate sensing data;
 comparing the program data and the sensing data and generating a result of the comparison; and
 selectively performing a first verification operation when the comparison result has a first value and a second verification operation when the comparison result has a second value that is different from the first value, wherein:
 the first verification operation boosts a verification voltage applied to the memory cell array, during a predetermined period, from a first voltage to a second voltage, which differs from the first voltage, and
 the second verification operation boosts the verification voltage applied to the memory cell array, during the predetermined period, from the second voltage to a third voltage, which differs from each of the first and second voltages.

17. The method of claim 16, wherein storing the program data comprises programming the plurality of memory cells using an incremental step pulse programming (ISPP) process.

18. The method of claim 16, wherein comparing comprises:
- performing the comparison of the program data and the sensing data; and
- generating an identification code based on the result of the comparison.

19. The method of claim 18, wherein a number of bits of the identification code is set based on a number of types of program states stored in each of the plurality of memory cells.

20. The method of claim 16, wherein each of the first and second verification operations comprises sensing, during the predetermined period, data programmed to the memory cell array using the verification voltage applied to the memory cell array.

* * * * *